(12) United States Patent
Barron-Jimenez et al.

(10) Patent No.: US 10,622,787 B2
(45) Date of Patent: Apr. 14, 2020

(54) DUAL QUANTUM CASCADE LASER MICROPACKAGE

(71) Applicant: Pranalytica, Inc., Santa Monica, CA (US)

(72) Inventors: Rodolfo Barron-Jimenez, Los Angeles, CA (US); C. Kumar N. Patel, Los Angeles, CA (US)

(73) Assignee: PRANALYTICA, INC., Santa Monica, CA (US)

( * ) Notice: Subject to any disclaimer, the term of this patent is extended or adjusted under 35 U.S.C. 154(b) by 0 days.

(21) Appl. No.: 16/259,764

(22) Filed: Jan. 28, 2019

(65) Prior Publication Data

US 2019/0237939 A1 Aug. 1, 2019

Related U.S. Application Data

(60) Provisional application No. 62/622,759, filed on Jan. 26, 2018.

(51) Int. Cl.
| | |
|---|---|
| *H01S 5/40* | (2006.01) |
| *H01S 5/00* | (2006.01) |
| *H01S 5/34* | (2006.01) |
| *G02B 5/30* | (2006.01) |
| *G02B 27/09* | (2006.01) |
| *G02B 27/14* | (2006.01) |
| *G02B 27/28* | (2006.01) |
| *H01S 5/022* | (2006.01) |
| *H01S 5/024* | (2006.01) |
| *H01S 5/068* | (2006.01) |

(52) U.S. Cl.
CPC .......... *H01S 5/4012* (2013.01); *G02B 5/3058* (2013.01); *G02B 27/0922* (2013.01); *G02B 27/141* (2013.01); *G02B 27/283* (2013.01); *H01S 5/0071* (2013.01); *H01S 5/02216* (2013.01); *H01S 5/02288* (2013.01); *H01S 5/3401* (2013.01); *H01S 5/3402* (2013.01); *H01S 5/02476* (2013.01); *H01S 5/06804* (2013.01)

(58) Field of Classification Search
CPC .. H01S 5/4012; H01S 5/0071; H01S 5/02288; H01S 5/3401; G02B 5/3058; G02B 27/0922; G02B 27/141; G02B 27/283
See application file for complete search history.

(56) References Cited

U.S. PATENT DOCUMENTS

2016/0301187 A1* 10/2016 Weida ..................... H01S 3/082
2016/0370145 A1* 12/2016 Houde-Walter .......... F41G 1/35

* cited by examiner

*Primary Examiner* — Armando Rodriguez
(74) *Attorney, Agent, or Firm* — Cislo & Thomas, LLP (57) ABSTRACT

The present invention is directed to an ultra-compact dual quantum cascade laser assembly that nearly doubles the strength of a traditional laser in a in a single hermetically sealed micropackage. The device may comprise two quantum cascade lasers that meet at a combiner to create a single laser with a higher strength than traditional lasers. The current invention provides a path to an ultra-compact coherent beam combing arrangement that uses both dichroic beam combining and polarization beam combining techniques.

13 Claims, 11 Drawing Sheets

Dolphin Results

| Laser | Wavelength | Power |
|---|---|---|
| #1 | ~4.6 μm | 1.73 W |
| #2 | ~4.6 μm | 1.39 W |
| Combined | | 3.06 W§ |

§ Power loss in combining: 60 mW (<2%)

Zebra Results

| Laser | Wavelength | Power |
|---|---|---|
| #1 | ~4.0 μm | 1.0 W |
| #2 | ~4.6 μm | 1.5 W |
| Combined | | 2.4 W§ |

§ Power loss in combining: 60 mW (<4%)

Figure 10
Zebra Results

| Laser | Wavelength | Power |
|---|---|---|
| # 1 | ~4.0 μm | 1.0 W |
| # 2 | ~4.6 μm | 1.5 W |
| Combined | | 2.4 W§ |

§ Power loss in combining: 60 mW (<4%)

Figure 11
Zebra Combined Output Spectrum

DUAL QUANTUM CASCADE LASER MICROPACKAGE

CROSS-REFERENCE TO RELATED APPLICATION

This patent application claims the benefit of U.S. Provisional Patent Application Ser. No. 62/622,759, entitled "Dual Quantum Cascade Laser Micropackage," filed Jan. 26, 2018, which is incorporated in its entirety here by this reference.

TECHNICAL FIELD

This invention relates to an ultra-compact coherent beam combing arrangement that may use both dichroic beam combining and polarization beam combining for compact packaging.

BACKGROUND

Many applications require coherent combination of two or more lasers producing a single collimated, coaxial beam. These range from experiments in nonlinear optics (e.g., difference-frequency mixing) to spectroscopy applications such as Coherent Anti-stokes Raman Spectroscopy (CARS). Other applications requiring high brightness can also benefit from the optical power addition of combining beams. Beam arrays are an example of a solution to high brightness using multiple beam sources. Beam arrays using multiple beams that are spatially located close to each other, but are not coaxial, do not produce a coherently combined beam, which will have a very poor beam quality.

SUMMARY

The present invention is directed to an ultra-compact dual quantum cascade laser assembly that nearly doubles the performance of a traditional laser in a single hermetically sealed micropackage. The device may comprise two quantum cascade lasers with beam outputs that meet at a combiner to create a single laser beam with a higher power than traditional lasers. The current invention provides a path to an ultra-compact coherent beam combing arrangement that uses both dichroic beam combining and polarization beam combining ideas, never heretofore developed for compact packaging.

DETAILED DESCRIPTION OF THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

The present invention is directed to an ultra-compact dual quantum cascade laser assembly 100 that nearly doubles the performance of a traditional laser in a single hermetically sealed micropackage 122. In some embodiments the present invention may comprise two lasers 102, 104, a combiner 112, two collimating lenses 106, 108, a reflector 110, and an exit port 118.

In some embodiments, the lasers may be, for example, quantum cascade lasers that may be the same wavelengths. The combiner may be a dichroic mirror 112, a polarizer 113, or some other method of combining beams into a singular beam 128.

Spectral Beam Combining

The device 100 may comprise two quantum cascade lasers 102, 104 that emit laser beams 124, 126 and meet at a combiner 112 to create a single beam 128 with a higher performance than the beams of the individual lasers alone. The current invention provides a path to an ultra-compact coherent beam combing arrangement that uses both dichroic beam combining or polarization beam combining ideas, never heretofore developed for compact packaging. Spectral beam combining may be achieved using a combiner 112, which may be a dichroic mirror, polarizer, or other various elements.

Figure 1:
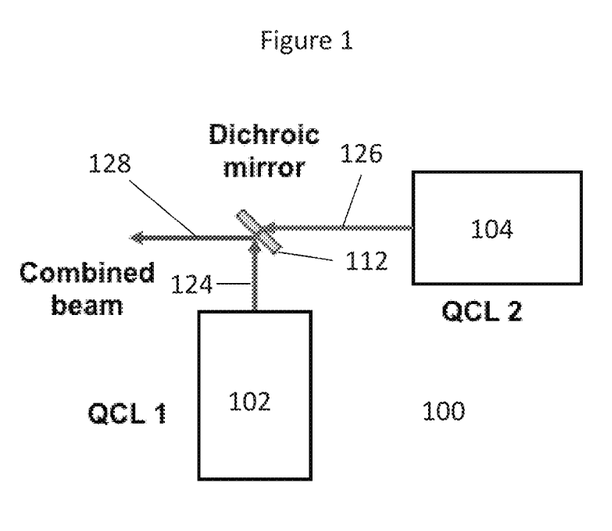
FIG. 1 shows a conceptual top view of the device in an embodiment using a dichroic mirror.
Figure 2:
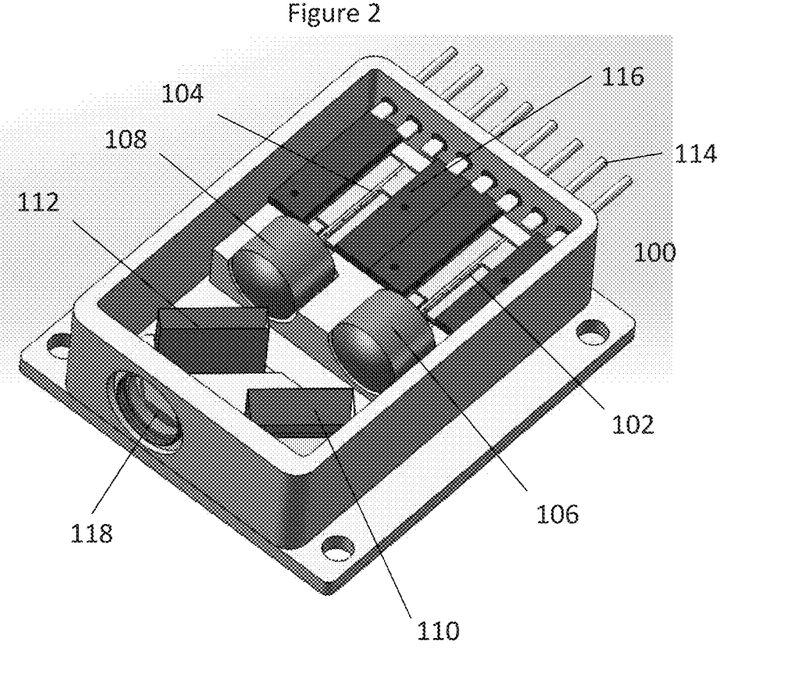
FIG. 2 shows a perspective view of the device in an embodiment using a dichroic mirror.

FIGS. 1 and 2 demonstrate current devices showing two beams summing when the wavelengths of two beams 124, 126 differ from each other by approximately 100 nm, dichroic mirror coatings can be developed or are often available for reflecting one beam 124 while transmitting the other beam 126. In some embodiments of combining the beams, the present device may be configured to spatially and directionally match the beams 124, 126 to yield a single collimated, coaxial output beam 128.

This may be accomplished by configuring the device so the two beams 124, 126 meet at the same physical location on the reflecting surface of a dichroic mirror 112 which may be accomplished by correctly pointing and aligning the collimated beams 124, 126 from separate quantum cascade lasers 102, 104.

In an embodiment of the invention the device may be configured to arrange the angular alignment of the two beams 124, 126 at the same physical location on the dichroic mirror 112, through minor adjustment of the path of the beam from a first laser 102, while keeping the physical location of its beam 124 unchanged on the reflecting surface of the dichroic mirror 112.

In some embodiments a dual laser micropackage 100 is configured to combine two lasers 102, 104, which may emit beams of different wavelengths 124, 126. For example, in some embodiments, this structure may include one laser 102 that emits a beam 124 at approximately 4.0 micrometer and another laser 104 that emits a second beam 126 at approximately 4.6 micrometer.

For example, FIG. 2 shows the internal construction of an embodiment of the dual laser micropackage 100 wherein the device is configured to utilize two lasers 102, 104, two collimating lenses 106, 108, a reflector 110, and a dichroic mirror as the beam combiner 112. In this embodiment there are two lasers 102, 104 configured to output beams 124, 126 with a wavelength of approximately the 4.0 micrometer and 4.6 micrometer respectively. The quantum cascade lasers may be mounted on, for example, a copper heat spreader 116. In this embodiment each laser may have four electrical pins 114 at the rear of the device 100, two may be for driving the lasers 102, 104 and two may be for laser temperature monitoring. The beams 124, 126 output from each of the lasers 102, 104 may be collimated using high numerical aperture lenses 106, 108. The reflector 110 and the dichroic beam combiner 112 may be aligned and permanently affixed in position for long-term stability. This embodiment may be configured to have, for example, 4.0 micrometer and 4.6 micrometer beams 124, 126 emerge from the laser package as a single beam 128. The single beam 128 may be, for example, a collimated coaxial beam 128. Alignment of the beams 124, 126 may be achieved in this embodiment by adjustment of the collimating lenses 106, 108 on the individual lasers 102, 104, which may allow for small changes in X-Y position and pointing before the collimating lenses 102 and 106 are permanently affixed in their respective positions and sealing the contents of the device in a hermetically sealed micropackage 100.

In some embodiments, the first quantum cascade laser and the second quantum cascade laser may be positioned parallel to each other. The first laser may be configured to emit a first laser beam defining a first path. The second laser may be configured to emit a second laser beam defining a second path.

Additionally, the first collimating lens may be positioned adjacent to the first laser in line with the first path and the second collimating lens may be positioned adjacent to the second quantum cascade laser in line with the second path. The reflector may be positioned adjacent to the first collimating lens and at an approximately 45 degree angle relative to the first path to cause the first laser beam to emit along a third path perpendicular to the first path. The dichroic mirror may be positioned adjacent to the reflector and adjacent to the second collimating lens so as to form an approximately a 45 degree angle with the second path and an approximately 45 degree angle with the third path.

Polarization Beam Combining

Figure 4:
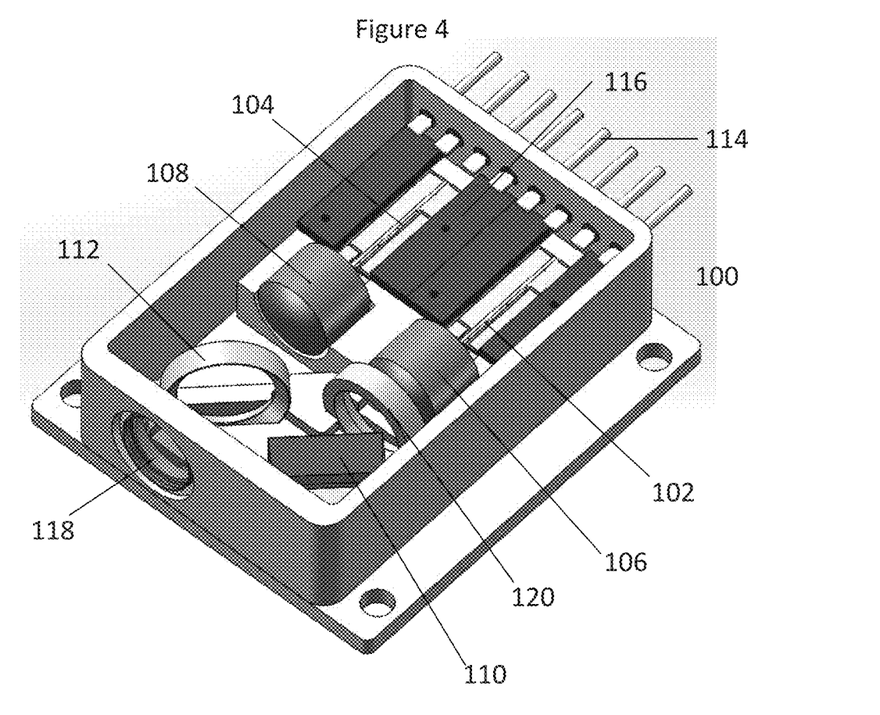
FIG. 4 shows a perspective view of the device in an embodiment using a polarizer.

In another embodiment of FIG. 4, to coherently combine radiation from two lasers 102, 104 the device may be configured to emit broadband radiation, which may be, for example, similar to that of Fabry Perot configuration quantum cascade lasers. In some embodiments, the lasers 102, 104 may be configured to emit beams 124, 126 at the same wavelength. However, it should be noted that polarization beam combining does not require the two laser wavelengths be nearly the same. By same, we do not mean exactly the same. Furthermore, the polarization beam combining scheme will may work with any combination of laser wavelengths. But, if the two wavelengths are approximately the same, polarization beam combining may be required. When an embodiment is configured to have the lasers 102, 104 configured to emit beams 124, 126 to be at the same wavelength, polarization beam combining techniques become necessary, which may require linearly polarized output beams 124, 126 from both lasers 102, 104. In an embodiment of the present invention, the lasers 102, 104 are configured to naturally emit linearly polarized light output beams 124, 126 along a first and second path respectively. The two linearly polarized output beams 124, 126 may be orthogonal, and may be combined using a polarizer 112 that will reflect one polarized beam 124 while transmitting the other orthogonally polarized beam 126. The polarizer 112 may be a wire grid polarizer or various other types of polarizers. The resulting beam 128 becomes unpolarized. The outputs from the lasers 102, 104 may be linearly polarized, however, an embodiment of the present device may be configured to rotate the polarization of one of the quantum cascade lasers 102 by 90°, using a half wave plate 120.

Figure 3:
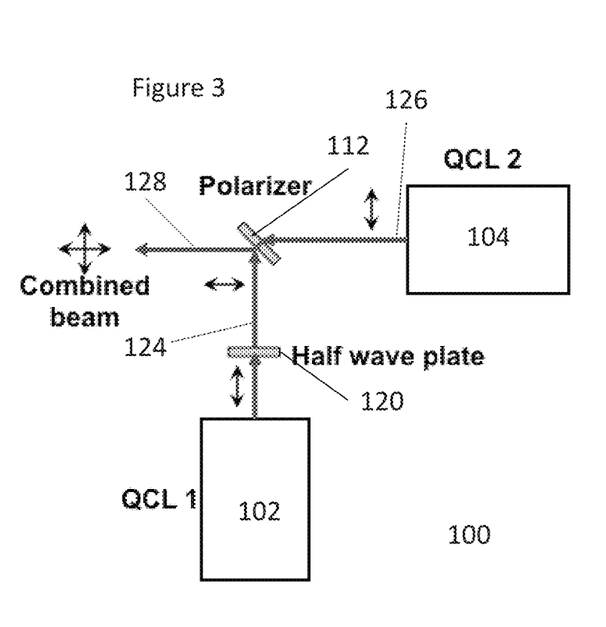
FIG. 3 shows a conceptual top view of the device in an embodiment using a polarizer.

FIG. 3 shows a schematic of the polarization beam combining technique. As was with the embodiment using a dichroic beam combining technique (FIGS. 1 and 2), the combined beam 128 may have both beams 124, 126 spatially and directionally matched to yield a single collimated coaxial output beam 128.

In some embodiments, the two beams 124, 126 meet at the same physical location on the reflecting surface of a polarizer 112, which may be accomplished by correctly pointing collimated output beams 124, 126 from two different lasers 102, 104.

The angular alignment of the two beams 124, 126, which may be located on the same physical location on a polarizer 112, may be achieved by minor adjustment of the pointing direction of the beam 124 from a first laser 102, while keeping the physical location of its beam unchanged on the reflecting surface of the polarizer 112.

In some embodiments of the present device, the dual laser micropackage design 100 may be configured to combine two beams 124, 126 of the same wavelength output from lasers 102, 104. For example, an embodiment may include, for example, two lasers 102, 104 that output beams 124, 126 with a wavelength of 4.6 micro-meters.

FIG. 4 shows the internal configuration of an embodiment of a laser micropackage 100 using the polarization techniques described above. In this embodiment, two lasers 102, 104, both outputting beams 124, 126 at, for example, 4.6 micrometers, may be mounted on a heat spreader 116. The heat spreader 116 may be a copper heat spreader or other suitable high conductivity metallic heat spreaders. Each laser 102, 104 may have four electrical pin connections 114 at the rear of the package, two may be for driving the lasers 102, 104 and two may be for quantum cascade laser temperature monitor thermistor. In some embodiments, the output beam 124, 126 from each of the lasers 102, 104 may be linearly polarized (vertical) and may be collimated using high numerical aperture lenses 106, 108. The first beam 124 may pass through a half wave plate 120 that rotates the first beam's polarization by approximately 90 degrees. This process may result in the beam 124 being incident onto the polarizer 112. The polarizer 112 may be configured to reflect a first laser's beam polarization 124, while transmitting an orthogonal polarization of the beam 126 from a second laser 104. In some embodiments, the half wave plate 120, the reflector 110, and the polarizer 112 may be aligned and permanently affixed in position for long-term stability. The components may also be secured by means such as cements, glues, welding, or other suitable means for attachment, resulting in a secure device 100 with no moving parts. In some embodiments, for example, 4.6 micrometers beams 124, 126 may emerge from the laser package as a collimated coaxial beam 128. Final alignment of the beams 124, 126 may be achieved by adjustments of the collimating lenses 106, 108, which may allow for small changes in X-Y position and angular pointing before curing the glue or otherwise permanently securing the components of the device into the micropackage 100.

In some embodiments the first quantum cascade laser and the second quantum cascade laser may be positioned parallel to each other. The first laser may be configured emit a first laser beam defining a first path. The second laser may be configured to emit a second laser beam defining a second path. The first collimating lens may be positioned directly adjacent to the first quantum cascade laser in line with the first path and the second collimating lens may be positioned directly adjacent to the second quantum cascade laser in line with the second path. The half-wave plate may positioned adjacent to the first collimating lens in line with the first path. The reflector may be positioned adjacent to the half-wave plate and at an approximately 45 degree angle relative to the first path to cause the first laser beam to emit along a third path perpendicular to the first path. The wire grid polarizer may be positioned adjacent to the reflector and adjacent to the second collimating lens so as to form an approximately a 45 degree angle with the second path and a 45 degree angle with the third path. The exit port may be located adjacent to the wire grid polarizer. Finally, the first laser and the second laser combine into a consolidated third laser at the wire grid polarizer and the consolidated third laser may pass through the exit port.

Figure 5:
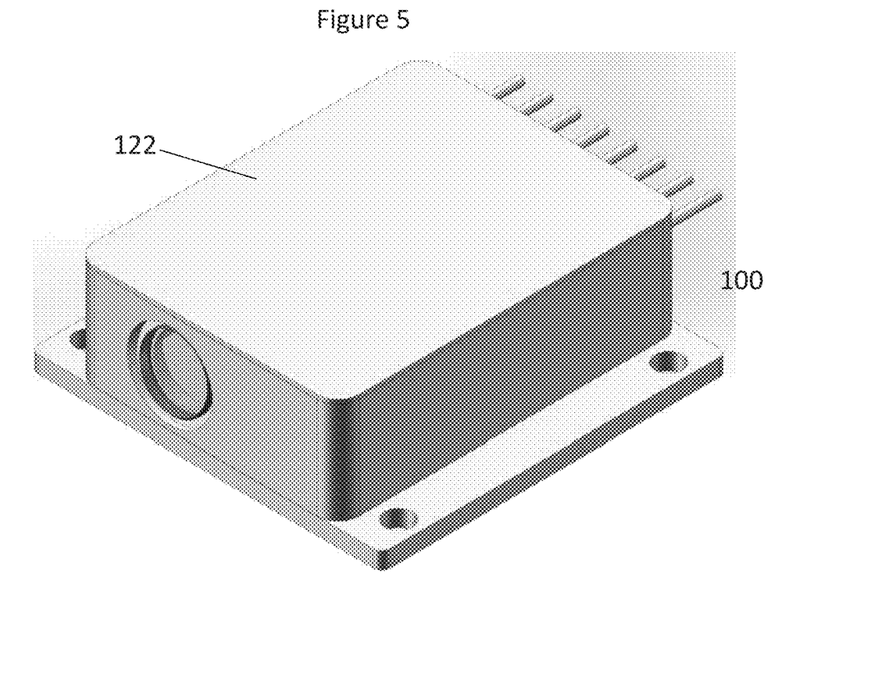
FIG. 5 shows a perspective view of an embodiment of the hermetically sealed micropackage.

In some embodiments as shown in FIG. 5, the present invention may be configured to implement a miniature micropackage 100 to provide the capability of installing two lasers 102, 104, that emit beams 124, 126 of the same color (wavelength) or of differing colors (wavelengths) in a single hermetically sealed micropackage 100 along with the necessary optical components shown in, for example, FIGS. 2 and 4. Permanent alignment of the optical beam combining elements may be achieved through exacting tolerances in manufacturing. In some embodiments, the device may be configured so that the only components that are adjustable during the fabrication process are the beam collimating lenses 106, 108 for the individual lasers 102, 104 that may permit small adjustments in beam 124, 126 location and direction. In such an embodiment, once the collimating lenses 106, 108 are correctly positioned, they may be permanently affixed in their locations (as may be the other optical components) to provide a final micropackage 100 that meets MIL-STD 810G environmental standards.

In some embodiments, the micropackage may house two lasers 102, 104 as shown in, for example, FIGS. 2 and 4. In some embodiments, the mechanical dimensions of the micropackage 100 may be approximately 1.25" (W)×1.40" (D)×0.42" (H). The complete assembly may weigh, for example less than 55 grams. In other embodiments, the dimensions may be adjusted for different internal configurations with similar volume and weight.

To assure ruggedness, some embodiments of the dual laser micropackage 100 may be configured to have no moving parts. All optics within an embodiment of the present micropackage may be glued using optical UV curing cements. Additionally, in another embodiment the optics may be secured by other various adhesives such as cement, and glue or through using laser welding. The present invention may be configured to comply with MIL-STD 810G environmental requirements.

In an embodiment of the present invention the micropackage 122 may be configured to be hermetically sealed to provide an inert internal atmosphere.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims and the equivalents to the claims appended hereto.

In FIG. 4, the two quantum cascade lasers ("QCL"), QCL1 102 and QCL2 104, may produce broad band laser outputs at approximately 4.6 micro-meters with power levels of approximately 1.73 W and 1.39 W, respectively. Both laser outputs may be vertically polarized and may be collimated using the lenses 106, 108 shown. Collimated laser radiation from QCL1 102 may pass through the half-wave plate 120, which rotates the polarization of QCL1 102 radiation by 90 degrees, making the polarization horizontal. The reflector may turn the direction of the QCL1 102 radiation by a right angle and the radiation may become incident on the wire grid polarizer 112. The wire grid polarizer 112 may be arranged so as to reflect the horizontally polarized light output, thus, the QCL1 102 radiation may now be coming down in FIG. 4. In some embodiments such as the collimated QCL2 104, radiation, which may be vertically polarized, passes through the wire grid polarizer 112 unimpeded. The directions and positions of the radiations from the two QCLs, at their meeting place on the wire grid polarizer 112, may be adjusted so that the two beams meet at the same location on the polarizer 112 (at the reflecting surface for QCL2 104 radiation) and upon reflection of the QCL1 102 radiation and transmission of QCL2 104 radiation, the two beams may emerge collinearly and coaxially.

Figure 6:
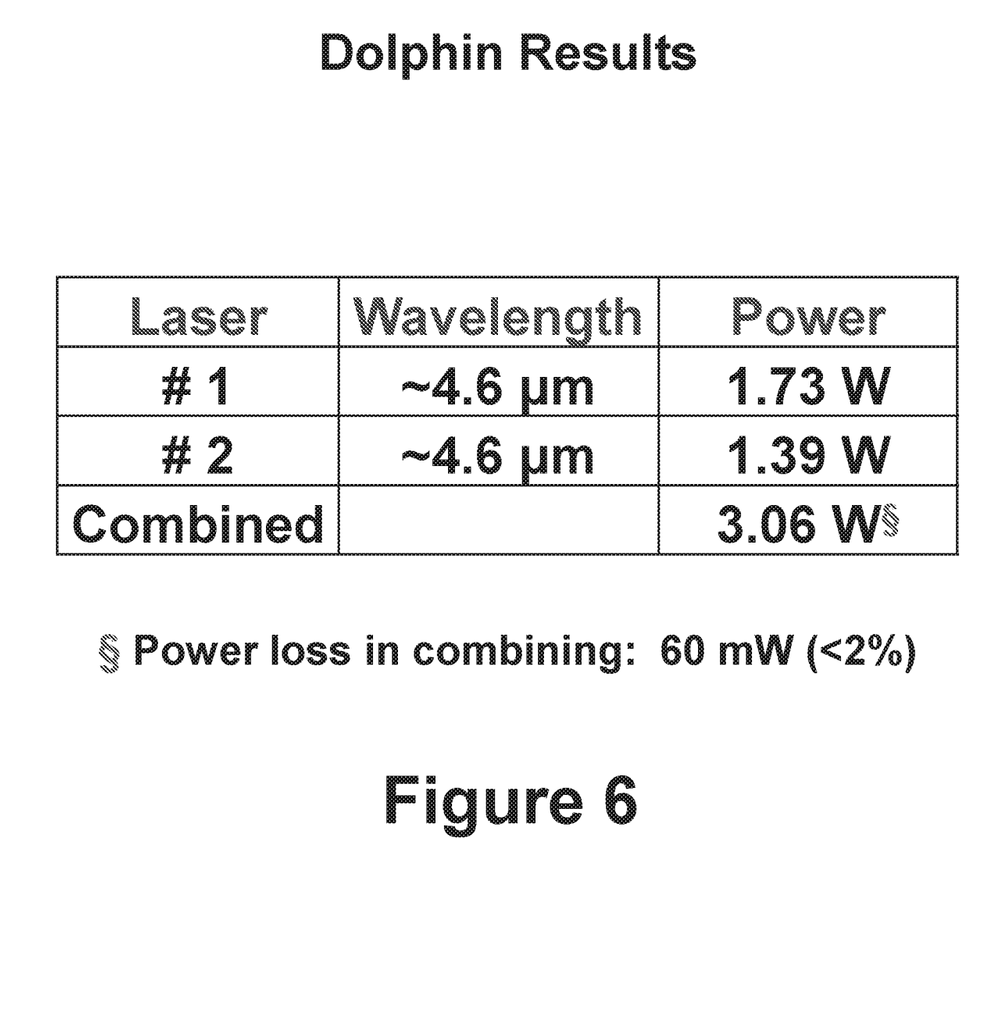
FIG. 6 shows the results of a polarization beam combining arrangement.

FIG. 6 documents the results of some embodiments of beam combining. The combined single coaxial beam may have a power output of approximately 3.06 W, corresponding to a loss of approximately less than 2 percent from the total of the individual laser outputs, confirming the high efficiency of beam combining.

Figure 7:
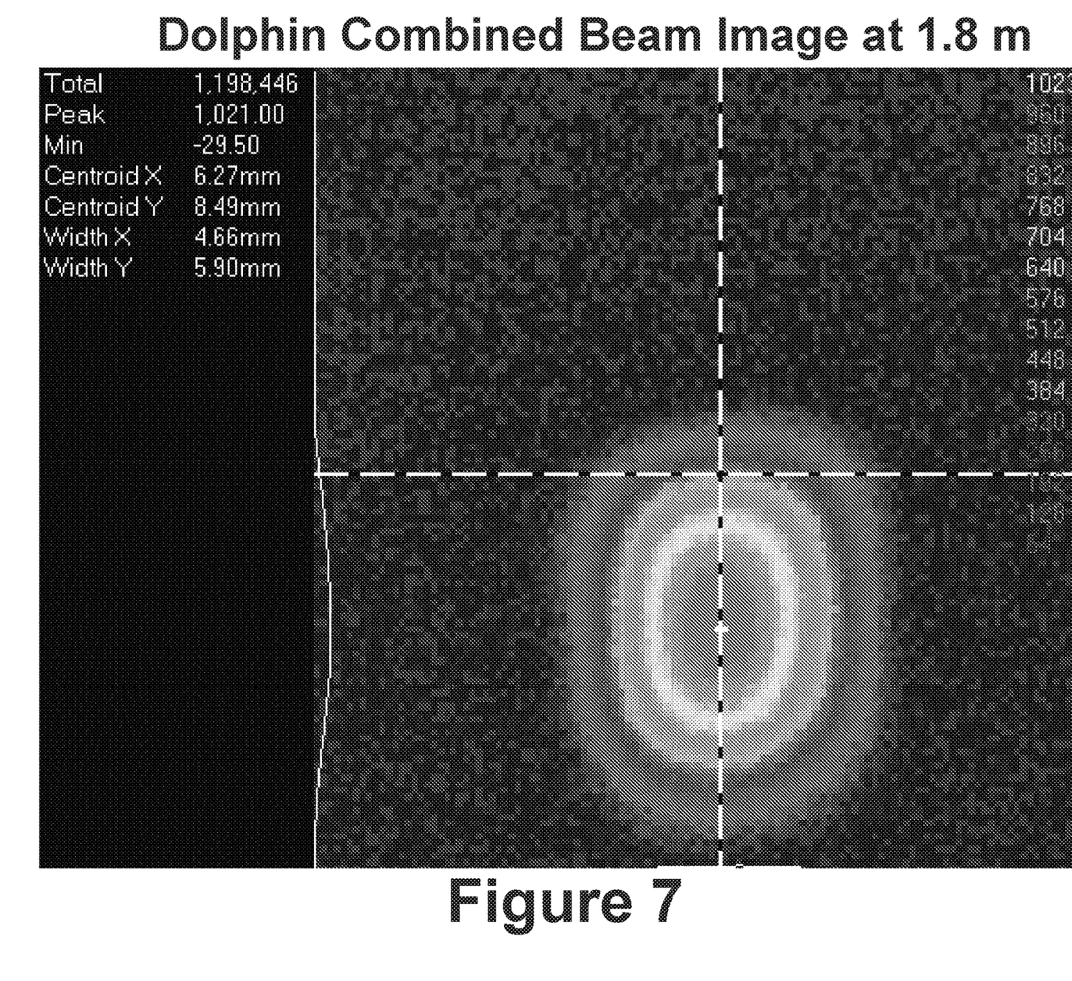
FIG. 7 shows a photograph of a combined single beam emerging from an experimental verification.

FIG. 7 documents the beam combing feature of some embodiments of the invention by providing a photograph of the 3.06 W beam emerging from the beam combiner, taken at a distance of 1.8 m from the exit of the beam combiner. A single beam image confirms the beam combining efficacy of the invention.

FIG. 2 shows beam combining for some embodiments of the invention where the two laser beams may have different wavelengths. QCL1 102 may be a laser at approximately 4.0 micro-meters producing a power of about 1.0 W and QCL2 104 may be a laser at approximately 4.6 micro-meters, producing a power output of about 1.5 W. Power outputs of both QCLs may be vertically polarized and may be collimated using the collimating lenses 106, 108 as shown. In FIG. 2, both beams may be propagating horizontally and to the left. The collimated QCL1 102 beam may be reflected from the reflector and may now be coming down vertically in the figure and it may be reflected from the front face of the dichroic mirror 112 as shown. The dichroic mirror 112 may be highly reflecting at approximately 4.0 micro-meters and may be highly transmissive at approximately 4.6 micro-meters. The reflected QCL1 102 light may now emerging horizontally, as seen in the figure. Collimated light output from QCL2 104 travelling horizontally in the figure, may pass through the dichroic mirror 112 at the same spot where the QCL1 102 radiation is reflected. The reflected QCL1 102 light may now emerging horizontally, as seen in the figure. The combined beam may now contain QCL1 102 radiation at approximately 4.0 micro-meters and the QCL2 104 radiation at approximately 4.6 micro-meters, which may be collinear and coaxial.

Figure 8:
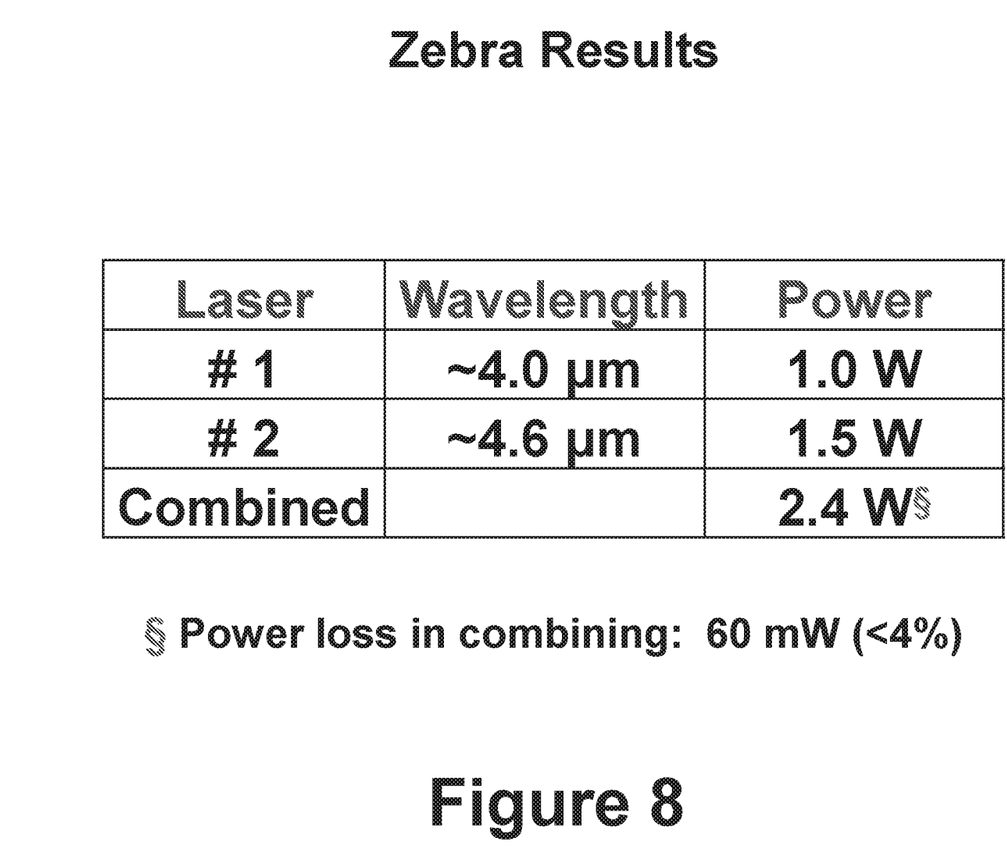
FIG. 8 shows the results of an dichroic beam combining arrangement.

FIG. 8 shows the results the dichroic beam combing invention in some embodiments. The total power output may now be approximately 2.4 W, corresponding to approximately less than 4 percent loss of power of the two individual beams.

Figure 9:
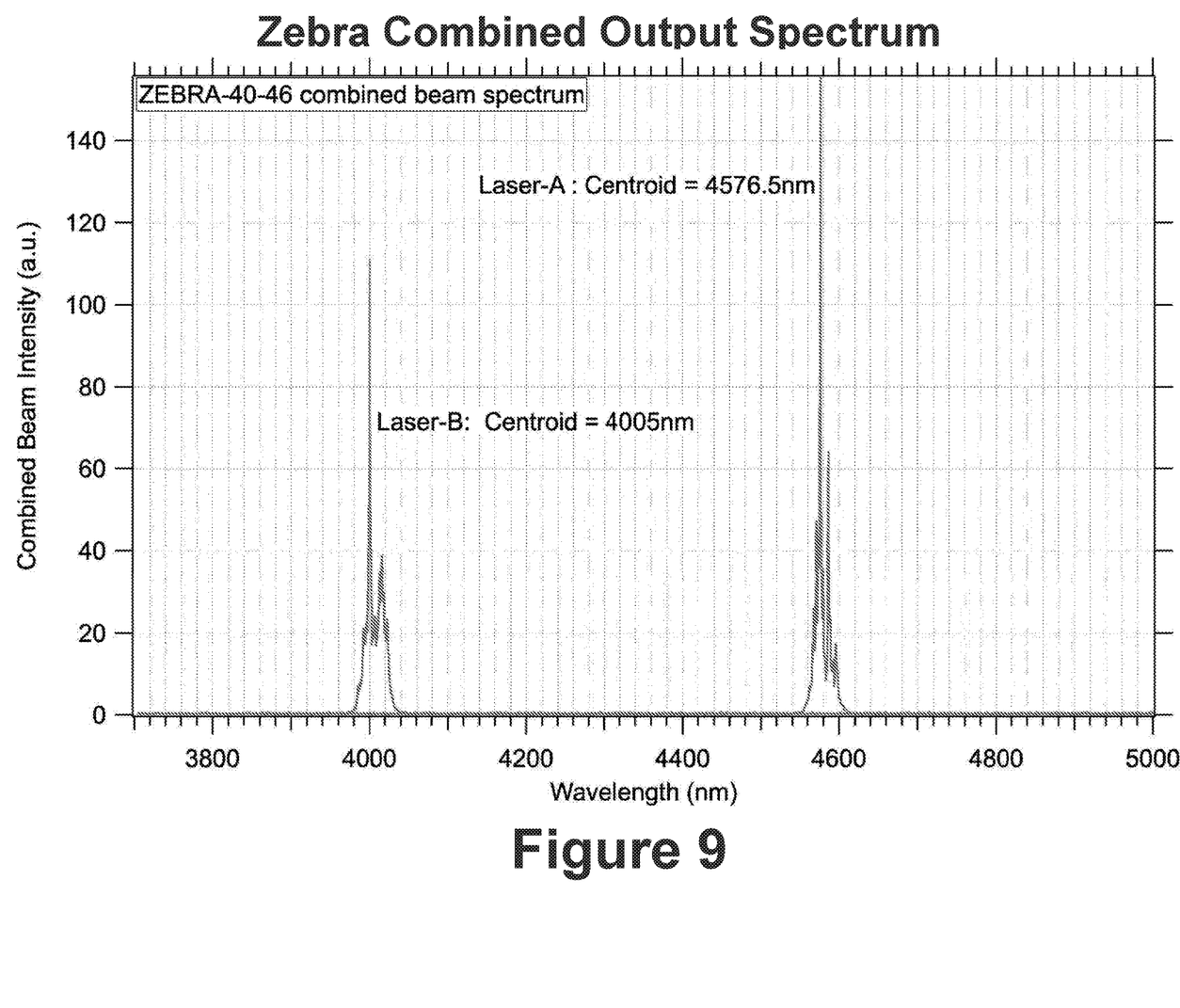
FIG. 9 shows a spectral scan of the single combined beam.
Figure 10:
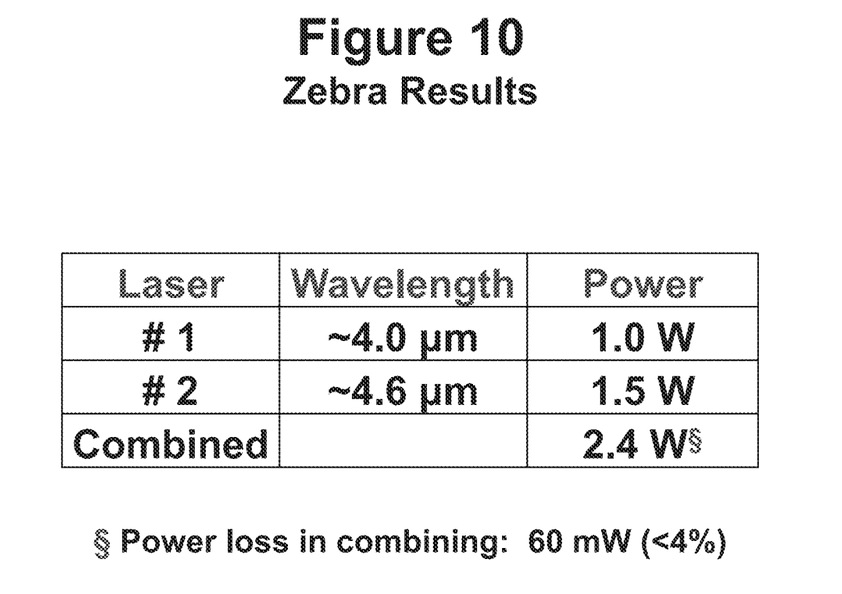
Figure 11:
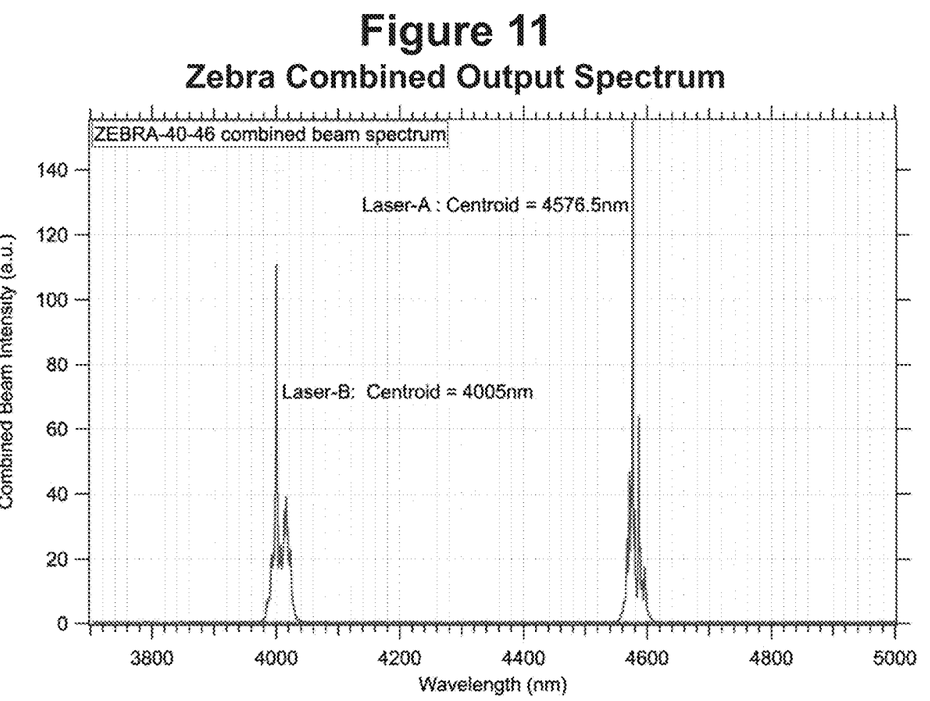

FIG. 9 shows some embodiments of spectral analysis of the single combined beam emerging from the arrangement in FIG. 9, the analysis may be carried out using a Fourier Transform Infrared Spectrometer. Both radiations, one at approximately 4.0 micro-meters and the other at approximately 4.6 micro-meters are simultaneously available in a single beam.

In both cases, FIGS. 2 and 4, the platform on which the beam combining was accomplished may eventually be packaged inside a hermetically sealed package shown in FIG. 5.

What is claimed is:

1. An ultra-compact dual quantum cascade laser assembly comprising:
   a. a first quantum cascade laser configured to emit a first laser beam defining a first path;
   b. a second quantum cascade laser configured to emit a second laser beam defining a second path;
   c. a wire grid polarizer;
   d. a half-wave plate;
   e. a first collimating lens;
   f. a second collimating lens;
   g. a reflector; and
   h. an exit port;
   i. wherein the first quantum cascade laser and the second quantum cascade laser are positioned parallel to each other;
   j. wherein the first collimating lens is positioned directly adjacent to the first quantum cascade laser in line with the first path and the second collimating lens is positioned directly adjacent to the second quantum cascade laser in line with the second path;
   k. wherein the half-wave plate is positioned adjacent to the first collimating lens in line with the first path;
   l. wherein the reflector is positioned adjacent to the half wave plate and at an approximately 45 degree angle relative to the first path to cause the first laser beam to emit along a third path perpendicular to the first path;
   m. wherein the wire grid polarizer is positioned adjacent to the reflector and adjacent to the second collimating lens so as to form an approximately a 45 degree angle with the second path and a 45 degree angle with the third path;
   n. wherein the exit port is located adjacent to the wire grid polarizer;
   o. wherein the first laser beam and the second laser beam combine into a consolidated third laser at the wire grid polarizer and the consolidated third laser passes through the exit port.

2. The ultra-compact dual quantum cascade laser assembly of claim 1, wherein the first laser beam and the second laser beam are different wavelengths.

3. The ultra-compact dual quantum cascade laser assembly of claim 1, wherein the first quantum cascade laser, second quantum cascade laser, the wire grid polarizer, the half-wave plate, the first collimating lens, the second collimating lens, and the reflector are contained within a hermetically sealed micropackage.

4. The ultra-compact dual quantum cascade laser assembly of claim 3, wherein a height of the hermetically sealed micropackage is less than 2.5 inches, a width of the hermetically sealed micropackage is less than 2.5 inches, and a depth of the hermetically sealed micropackage is less than 1 inch.

5. The ultra-compact dual quantum cascade laser assembly of claim 1, wherein a weight of the ultra-compact dual quantum cascade laser is less than 70 grams.

6. The ultra-compact dual quantum cascade laser assembly of claim 1, wherein a combined power loss of the first laser beam and the second laser beam when combined into the consolidated third laser is less than 6 percent of a sum of a power of the first quantum cascade laser and a power of the second quantum cascade laser.

7. An ultra-compact dual quantum cascade laser assembly comprising:
   a. a first quantum cascade laser configured to emit a first laser beam defining a first path;
   b. a second quantum cascade laser configured to emit a second laser beam defining a second path;
   c. a dichroic mirror;
   d. a first collimating lens;
   e. a second collimating lens;
   f. a reflector; and
   g. an exit port;
   h. wherein the first quantum cascade laser and the second quantum cascade laser are positioned parallel to each other;
   i. wherein the first collimating lens is positioned adjacent to the first quantum cascade laser in line with the first path and the second collimating lens is positioned adjacent to the second quantum cascade laser in line with the second path;
   j. wherein the reflector is positioned adjacent to the first collimating lens and at an approximately 45 degree angle relative to the first path to cause the first laser beam to emit along a third path perpendicular to the first path;
   k. wherein the dichroic mirror is positioned adjacent to the reflector and adjacent to the second collimating lens so as to form an approximately a 45 degree angle with the second path and a 45 degree angle with the third path;
   l. wherein the exit port is located adjacent to the dichroic mirror;
   m. wherein the first laser beam and the second laser beam are configured to combine into a consolidated third laser and the consolidated third laser is configured to pass through the exit port.

8. The ultra-compact dual quantum cascade laser assembly of claim 7, wherein the first quantum cascade laser and the second quantum cascade laser project laser beams that differ in wavelength by approximately 0.6 micro-meters.

9. The ultra-compact dual quantum cascade laser assembly of claim 7, wherein the a first quantum cascade laser, second quantum cascade laser, the dichroic mirror, the first collimating lens, the second collimating lens, and the reflector contained within a hermetically sealed micropackage.

10. The ultra-compact dual quantum cascade laser assembly of claim 7, wherein a height of the hermetically sealed micropackage is less than 2.5 inches, a width of the hermetically sealed micropackage is less than 2.5 inches, and a depth of the hermetically sealed micropackage is less than 1 inch.

11. The ultra-compact dual quantum cascade laser assembly of claim 7, wherein the weight of the ultra-compact dual quantum cascade laser is less than 70 grams.

12. The ultra-compact dual quantum cascade laser assembly of claim 7, wherein there are no moving parts in the ultra-compact dual quantum cascade laser assembly.

13. The ultra-compact dual quantum cascade laser assembly of claim 7, wherein a combined power loss of the first laser beam and the second laser beam when combined into the third laser is less than 6 percent of a sum of a power of the first quantum cascade laser and a power of the second quantum cascade laser.

* * * * *